United States Patent
Xu

(10) Patent No.: US 6,393,075 B1
(45) Date of Patent: May 21, 2002

(54) METHOD AND DEVICE FOR SOURCE-CONTROLLED CHANNEL DECODING USING KALMAN FILTER

(75) Inventor: Wen Xu, Unterhaching (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/472,059

(22) Filed: Dec. 23, 1999

Related U.S. Application Data

(63) Continuation of application No. PCT/DE98/01524, filed on Jun. 4, 1998.

(30) Foreign Application Priority Data

Jun. 23, 1997 (DE) .......................................... 197 26 600

(51) Int. Cl.$^7$ .............................................. H04L 27/06
(52) U.S. Cl. ....................... 375/341; 375/262; 375/265; 714/796
(58) Field of Search ................................. 375/341, 262, 375/265, 291; 714/796, 794, 795

(56) References Cited

U.S. PATENT DOCUMENTS

| | | | | |
|---|---|---|---|---|
| 4,644,564 A | * | 2/1987 | Dolivo et al. ................ | 375/291 |
| 5,432,821 A | | 7/1995 | Polydoros et al. .......... | 375/340 |
| 5,673,291 A | * | 9/1997 | Dent ........................... | 375/262 |
| 5,953,376 A | * | 9/1999 | Wei .............................. | 375/265 |
| 6,192,503 B1 | * | 2/2001 | Chennakeshu et al. ..... | 714/796 |

FOREIGN PATENT DOCUMENTS

| | | |
|---|---|---|
| DE | 44 24 214 C2 | 2/1995 |
| EP | 0 449 327 A2 | 10/1991 |

OTHER PUBLICATIONS

H. W. Sorenson: "Least–squares estimation: from Gauss to Kalman", IEEE Spectrum, vol. 7, pp. 63–68, Jul. 1970.

Joachim Hagenauer: "Source–Controlled Channel Decoding", IEEE Transactions on Communications 43 (1995) Sep., No. 9, New York, US, XP 000525669.

* cited by examiner

*Primary Examiner*—Stephen Chin
*Assistant Examiner*—Shuwang Liu
(74) *Attorney, Agent, or Firm*—Herbert L. Lerner; Laurence A. Greenberg; Werner H. Stemer

(57) ABSTRACT

Data are received by a receiver in a frame by frame transmission. The received data are processed in a maximum a posteriori probability algorithm using metric increments. In order to calculate the metric increments, use is made of reliability values which have been determined in an estimation unit, using a Kalman filter.

27 Claims, 5 Drawing Sheets

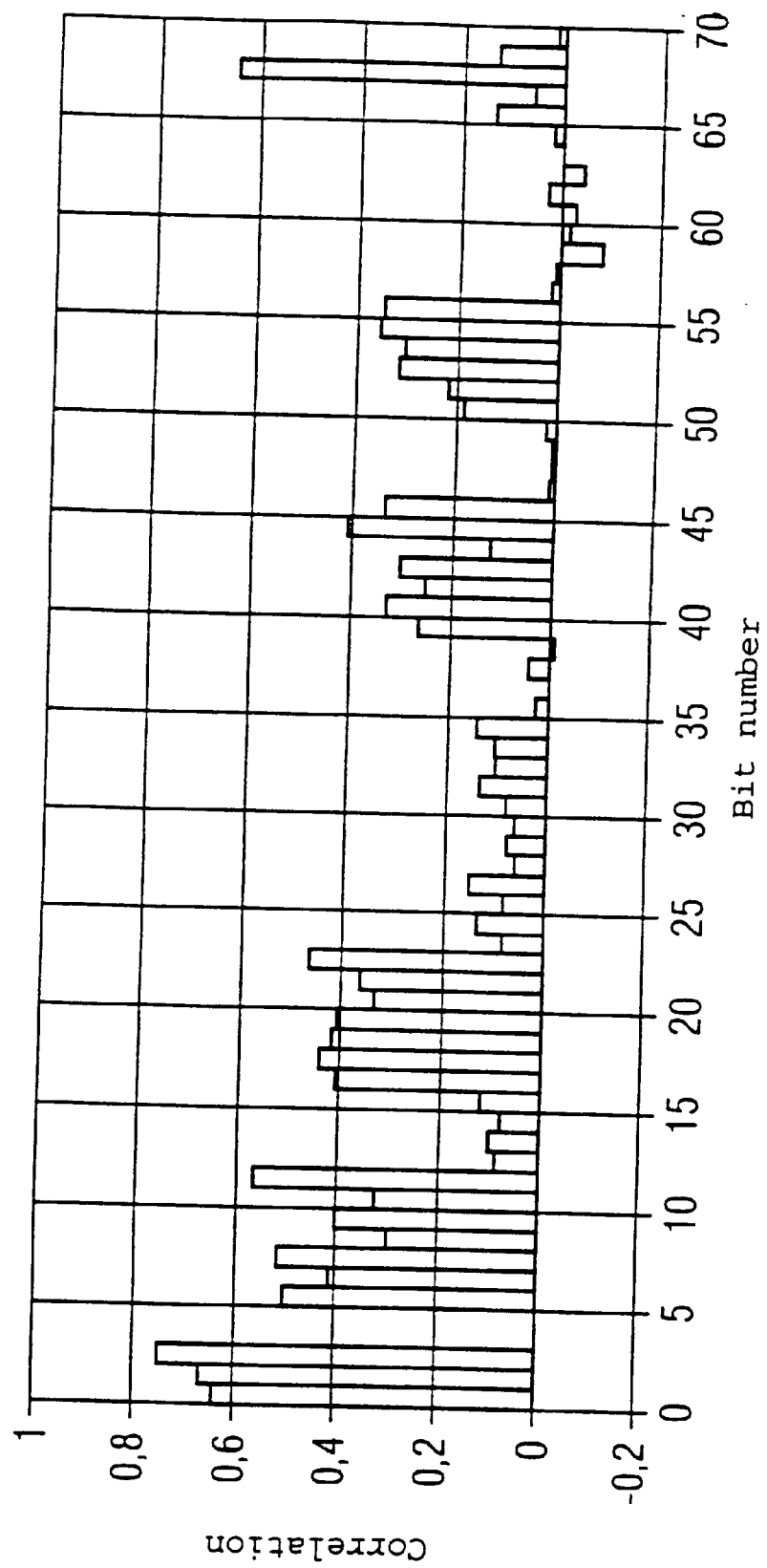

METHOD AND DEVICE FOR SOURCE-CONTROLLED CHANNEL DECODING USING KALMAN FILTER

CROSS-REFERENCE TO RELATED APPLICATION

This is a continuation of copending International Application PCT/DE98/01524, filed Jun. 4, 1998, which designated the United States.

BACKGROUND OF THE INVENTION

FIELD OF THE INVENTION

The invention lies in the telecommunications field. More specifically, the invention relates to a method for processing data received by a receiver, in which data transmitted in successive frames over a transmission link are received. One frame contains a predefined number of bit positions. The received data are processed by means of a maximum a posteriori probability algorithm using metric increments or a maximum likelihood algorithm, whereby the Viterbi algorithm is used. The metric increments for at least one bit position whose value and/or whose so-called reliability value is correlated from frame to frame are thereby calculated in dependence on a current reliability value determined for that bit position. The reliability value is a measure of the probability that the value of the bit position has a predefined value.

A method of this type is known for a Viterbi algorithm, for example from the article "Source-Controlled Channel Decoding" by Joachim Hagenauer in "IEEE Transactions on Communications", Volume 43, No. 9, September 1995, pages 2449–2457. Substantial parts of the article are also contained in U.S. Pat. No. 5,511,081 to Hagenauer (German patent DE 42 24 214 C2). In particular, formula (21) in the article specifies the calculation of new metrics $M_k(m)$ from old metrics $M_{k-1}(m)$ and an associated metric increment. The index m thereby denotes a specific path and k defines a specific bit position in a frame. A reliability value $L(u_k)$ is used in calculating the metric $M_k(m)$. On pages 2454 and 2455 of the article, the so-called HUK algorithm is suggested for the determination of the reliability value $L(u_k)$. The algorithm is thereby based on an empirical model in which the reliability values $L(u_k)$ are calculated similar to the so-called points in a German third-party liability insurance for cars. Because of the empirical character, the estimates for the reliability values $L(u_k)$ are inaccurate. The metric increments are either added to or multiplied by metrics already calculated.

The maximum a posteriori probability algorithm and the maximum likelihood algorithm are algorithms which compare a data sequence transmitted over the transmission link with reference sequences s, and determine the reference sequence s which, with the greatest probability, belongs to the transmitted data sequence. Maximum a posteriori probability means that reference sequence s is selected for which the probability P (s|y) becomes a maximum. The term y represents the received data sequence. Maximum likelihood means that reference sequence s is selected for which the probability P (y|s) becomes a maximum. The transmission link is, for example, a radio channel, a transmission line or else a storage medium from which data are read.

A multiple receiver which is insensitive to noise and has a number of receiving antennas is disclosed in U.S. Pat. No. 5,202,903 to Okanoue (European patent application EP 0 449 327). The received signals are generated by a single transmitted signal, which passes to the antennas via various transmission paths. Branch metrics for the implementation of a Viterbi algorithm are calculated from the received signals from the individual antennas. Before the algorithm is implemented, the branch metrics calculated in relation to the received signals from the individual antennas are weighted and combined. After the Viterbi algorithm has been implemented, this leads to the generation of a symbol sequence which agrees well with a transmitted symbol sequence on which the transmitted signal is based.

SUMMARY OF THE INVENTION

It is accordingly an object of the invention to provide a method and device for source-controlled channel decoding using a Kalman filter, which overcomes the above-mentioned disadvantages of the heretofore-known devices and methods of this general type and which specifies a simple method for determining the reliability values which calculates the current reliability values as far as possible without errors and accurately.

With the foregoing and other objects in view there is provided, in accordance with the invention, a method of processing data received by a receiver, which comprises:

receiving data transmitted in successive frames, each containing a predefined number of bit positions, via a transmission link;

processing the received data with a maximum a posteriori probability algorithm using one of metric increments and a maximum likelihood algorithm;

calculating the metric increments for at least one bit position, whose value and/or whose reliability value is correlated from frame to frame, in dependence from a current reliability value determined for the frame being currently processed, whereby the current reliability value is a measure of a probability that the value of the bit position has a predefined value;

determining the current reliability value by using at least one observed reliability value determined for the bit position from a previously processed frame or from the frame being currently processed; and determining the current reliability value such that a sum formed over several frames of the deviations of an error-free reliability value for the respective frame and of the reliability value determined for the same frame assumes a minimum.

The invention is based on the consideration that the current reliability values could be determined very accurately with an optimization method. However, the difficulty is that reliability values to be used for the optimization are based on an observation which is subject to errors. The errors can be attributed to disturbances during the transmission of the data over the transmission link and to results from the Viterbi algorithm which are subject to errors. Therefore, in the method according to the invention, the target function defined is the sum of the deviations of an essentially error-free reliability value for a frame and of the reliability value determined for the same frame. In this case, the deviation relates to the magnitude of the difference between the actual, error-free reliability value and the determined reliability value. The target function is minimized by the optimization method, so that the reliability values determined in order to implement the Viterbi algorithm approach the error-free reliability values very closely.

In the method according to the invention, the minimization of the target function can be carried out in spite of unknown error-free reliability values, since, in the optimization method, a mathematical model is used which produces a relationship between the reliability values based on the observations and the error-free reliability values. In addition, so-called a priori information is used in the model, that is to say information which is known before the transmission of the data over the transmission link, such as information relating to the correlation of the data or the correlation of the reliability values in successive frames. In this sense, the data source influences the further processing of the data. If the processing is decoding, for example, then one also speaks of source-controlled channel decoding.

In the case of a Viterbi algorithm without iteration, the reliability value based on the observation is generally available only after a delay of one frame. Accordingly, in order to determine the current reliability value, recourse must be had to an observed reliability value which has been determined for the bit position from a frame that has already been processed. If, on the other hand, a Viterbi algorithm with iteration is carried out, then a reliability value based on an observation for the frame currently being processed is already available in the second iteration step. In this case, this observed reliability value is used to determine the current reliability value.

The method according to the invention supplies better results by comparison with the known HUK algorithm, since it can be used to process severely fluctuating source signals, in which the HUK algorithm is not capable of estimating the reliability values sufficient accurately. In the method according to the invention, the reliability values used when implementing the Viterbi algorithm lie close to the actual reliability values, so that the probability of an error in selecting the path is reduced, since the reliability values used influence the selection of the path. Correct selection of a path leads, for example during decoding, to a correctly decoded bit sequence.

In a development of the invention, the reliability values are calculated in accordance with the following formula:

$$L(u_1) = \log \frac{P(u_1 = +1)}{P(u_1 = -1)}$$

The term $u_l$ represents the value of the bit position, which can preferably be "+1" or "−1". For instance, $P(u_l=+1)$ is the probability that the value in the bit position l considered is "+1". In a corresponding way, $P(u_l=-1)$ is the probability that the value in the bit position l is "−1".

In accordance with an added feature of the invention, during the optimization calculations are not carried out directly using the reliability values but using auxiliary reliability values, to which the following formula preferably applies:

$$m(u_l)=P(u_l=+1)-P(u_l=-1)$$

By comparison with the reliability values, the auxiliary reliability values have the advantage that they have a value range between "+1" and "−1" for probabilities p between "0" and "1". By contrast, the reliability values have function values from "−" to "+" in the function range specified, so that calculations are made more difficult in a restricted numeric region, such as is present in mechanical computers.

The conversion of reliability values to auxiliary reliability values and, respectively, from auxiliary reliability values to reliability values is carried out on the basis of a simple mathematical relationship which, for example, is stored in a memory in the form of tabular values.

By means of a recursive optimization in which the current reliability value or the current auxiliary reliability value is calculated recursively from the reliability value or the auxiliary reliability value for the frame last processed, it is possible for the computing outlay during the optimization to be reduced.

For the purpose of optimization, a so-called Kalman filter is advantageously used, in which the optimization is likewise carried out recursively. A filter of this type is specified, for example, in the article "Least-squares estimation: from Gauss to Kalman" by H. W. Sorenson, in IEEE Spectrum, Volume 7, pages 63–68, dated July 1970. The mathematical model based on the Kalman filter takes into account the fact that the actual reliability values can be determined only indirectly via the reliability values based on an observation which is subject to errors. In addition, the Kalman filter uses statistical properties of the reliability values and of the transmitted data and follows any rapid change in the values of the transmitted data at a sufficient speed.

The method according to the invention may be used advantageously when there are correlations between bit positions of successive frames. This is the case, for example, in the case of bit positions for more significant bits of parameters in a frame which is transmitted in a mobile radio system in accordance with the GSM standard. In a development of the method of the invention, the correlation in the above-mentioned bit positions is used in order to decode these bit positions.

With the above and other objects in view there is also provided, in accordance with the invention, a device for processing data received by a receiver and, in particular, for implementing the aforementioned method. The aforementioned technical effects therefore also apply to this device.

The device comprises:
  a receiving unit for receiving data transmitted via a transmission link in frames comprising a predefined number of bit positions;
  a metric increment unit connected to the receiving unit for processing the received data with a maximum a posteriori probability algorithm using one of metric increments and a maximum likelihood algorithm;
  a computing unit connected to the metric increment unit for determining, for at least one bit position whose value and/or reliability value is correlated from frame to frame, a current reliability value and outputting the current reliability value to the metric increment unit;
  the computing unit, in determining the current reliability value, using at least one observed reliability value which has been determined for the bit position from one of a previously processed frame and a frame currently being processed;
  the computing unit, in a first option, determining the reliability value such that a sum formed over several frames of the deviations of an error-free reliability value of a frame and of the reliability value determined for the same frame becomes a minimum;
  the computing unit, in a second option, determining the reliability value such that a sum formed over several frames of the deviations of an essentially error-free auxiliary reliability value for the respective frame and an auxiliary reliability value determined for the same frame becomes a minimum, the auxiliary reliability values) being calculated from the reliability values by one of a conversion function and an approximation function.

In accordance with a further aspect of the invention, the above-outlined objects are also satisfied with a method of processing data received by a receiver receiving data in successive frames each containing a predefined number of bit positions over a transmission link, which comprises:

processing the received data with a maximum a posteriori probability algorithm using one of metric increments and a maximum likelihood algorithm;

calculating the metric increments, for at least one bit position whose value and/or reliability value is correlated from frame to frame, from a current reliability value determined for the frame currently being processed, which is a measure of the probability that the value of the bit position has a predefined value;

determining the current reliability value with at least two observed reliability values, or at least two already determined reliability values, which are determined for the bit position from associated frames; and forming the current reliability value, by averaging the observed reliability values, or from the reliability values already determined.

In this case, the current reliability value is calculated from at least two observed reliability values by averaging. This measure is based on the finding that although the reliability value observed in each case does not coincide with the respective actual reliability value, errors in the observation cancel each other out as a result of the averaging.

In a development of the method with averaging, the latter is carried out only in relation to a predefined number of frames that have already been processed, the predefined number remaining constant over several averagings. As a result of this measure, preferably only the respective last section of the sequence of successive frames is taken into account, in a manner similar to that through a window. Rapid adaptation to changing conditions can thus take place. If the Viterbi algorithm is carried out recursively, the frame currently being processed is also included in the window.

In another development of the method with averaging, the data, for example, processed by the Viterbi algorithm, are used directly as observed reliability values. This measure therefore leads to a very accurate determination of the current reliability values, since the average of the processed data coincides with the auxiliary reliability value and the latter, as already mentioned, is a good approximation to the actual, error-free reliability value itself.

Finally, with the above and other objects in view there is also provided, in accordance with the invention, a device for processing received data, comprising:

a receiving unit for receiving data via a transmission link, whereby the data are transmitted in frames comprising a predefined number of bit positions;

a metric increment unit connected to the receiving unit for processing the received data by a maximum a posteriori probability algorithm using one of metric increments and a maximum likelihood algorithm;

a computing unit connected to the metric increment unit, the computing unit, for at least one bit position whose value and/or reliability value is correlated from frame to frame, determining a current reliability value and outputting the current reliability value to the metric increment unit, whereby the reliability value is a measure of a probability that the bit position has a predefined value; and the computing unit calculating the current reliability value by averaging at least two observed reliability values, or at least two already determined reliability values, determined for the bit position from associated frames.

Other features which are considered as characteristic for the invention are set forth in the appended claims.

Although the invention is illustrated and described herein as embodied in a method and device for source-controlled channel decoding using a Kalman filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a chart of the correlation coefficients for the bit positions 0 to 69 in a GSM full-rate encoded frame.

DESCRIPTION OF THE PREFERRED EMBODIMENTS

Figure 1:
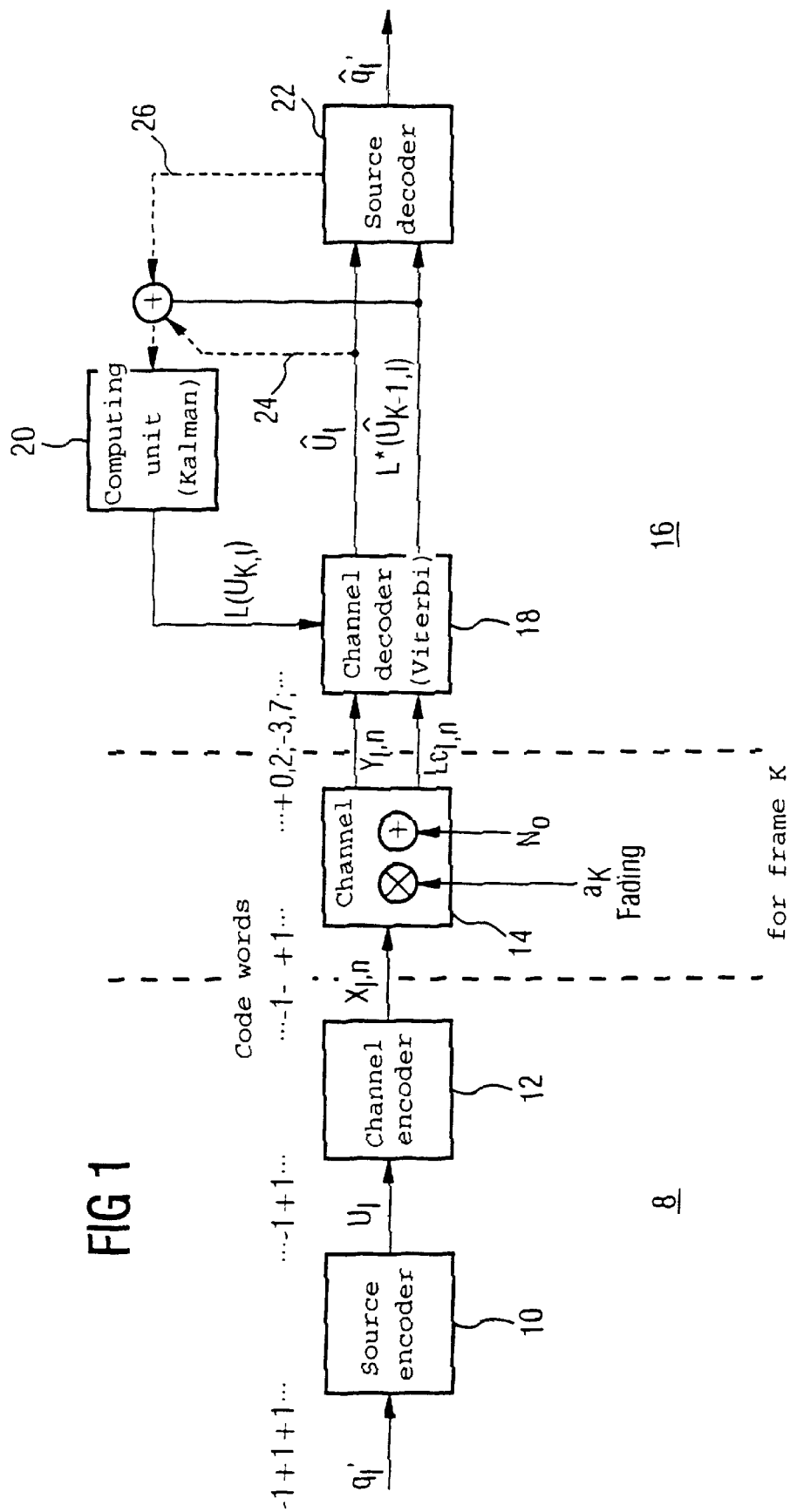
FIG. 1 is a block diagram with the significant functional units for a data transmission.

Referring now to the figures of the drawing in detail and first, particularly, to FIG. 1 thereof, there is seen a block diagram with significant functional units employed in an exemplary data transmission. Reference is essentially made here to the transmission of a frame k; for better clarity in FIG. 1 and in the following explanation of the figure, the index k, which assumes natural numbers, has only been included in those cases where a distinction of the frame k is of importance for the invention. The makeup of the frame k will be explained below with reference to FIG. 2.

A source symbol sequence $\{q_{l'}\}$ generated in a transmitter 8 comprises source symbols $q_{l'}$, which may take the values "+1" and "−1", for example, depending on the information to be transmitted. The index l' for the source symbols $q_{l'}$ transmitted in the frame k runs from 0 to L'−1, where L' is the number of source symbols $q_{l'}$ per frame k. The source symbol sequence $\{q_{l'}\}$ is compressed by a source coder 10, for example by a GSM full-rate voice coder. In the process, a source-encoded sequence $\{u_l\}$ of source-encoded symbols $u_l$ is generated. The source-encoded symbols $u_l$ have either the value "+1" or "−1". The index l within a frame runs from 0 to L−1, where L is the number of source-encoded symbols $u_l$ in a frame. L' is usually greater than L.

The source-encoded sequence $\{u_l\}$ is then encoded against channel disturbances in a channel encoder 12, use being made, for example, of a convolution code. A channel-encoded sequence $\{x_{l,n}\}$ is thereby produced from code words $x_l$. Within the code words $x_l$, the bit positions are designated by the index n, which runs from zero to N−1 within a code word $x_l$, where N is the number of bit positions in a code word $x_l$. The bit positions $x_{l,n}$ in the code words $x_l$ in turn have either the numeric value "+1" or "−1". The channel-encoded sequence $\{x_{l,n}\}$ is further processed in a non-illustrated modulator and then transmitted over a transmission link 14. During the transmission, disturbances occur, for example fading, described by a fading factor $a_k$, and noise, described by the noise factor $N_0$.

The transmission link 14 is located between the transmitter 8 and a receiver 16. The receiver 16 includes, if necessary, an antenna for receiving the signals transmitted over the transmission link 14, a sampling device, a demodulator for demodulating the signals, and an equalizer for eliminating the inter-symbol disturbances. These devices have not been illustrated in FIG. 1, for reasons of simplification. The equalizer outputs received values $y_{l,n}$ from a received sequence $\{y_{l,n}\}$.

The received values $Y_{l,n}$ have values which differ from "+1" and "−1", for example "+0.2" or "−3.7", because of the disturbances during the transmission over the transmission link 14.

The received values $y_{l,n}$ are further processed in a channel decoder 18. The convolution encoding carried out by the channel encoder 12 is reversed again in the channel decoder 18. The intention is to correct transmission errors. In the convolution decoding, use is made, for example, of the known Viterbi algorithm. In order to implement the Viterbi algorithm, the channel decoder 18 is also fed with channel state information $Lc_{l,n}$. During the implementation of the Viterbi algorithm in the channel decoder 18, a so-called metric $M_l^{(m)}$ of the path m for the bit position l is calculated in accordance with the following formula:

$$M_l^{(m)} = M_{l-1}^{(m)} + \sum_{n=0}^{N-1} \hat{x}_{l,n}^{(m)} Lc_{l,n} y_{l,n} + \hat{u}_l^{(m)} L(u_{k,l}) \tag{1}$$

where $M_{l-1}^{(m)}$ is the old metric of the path m, that is to say for the bit position l−1; $\hat{x}_{l,n}^{(m)}$ are the bits of the code word belonging to the path m and to the bit position l; $\hat{u}_l^{(m)}$ is the decoded symbol belonging to the code word $\hat{x}_l^{(m)}$; and $L(u_{k,l})$ is a determined reliability value, which is a measure of the probability that the source-encoded symbol $u_l$ is equal to "−1".

The reliability value $L(u_{k,l})$ is determined in a computing unit 20, whose configuration will be explained below with reference to FIGS. 3 and 4.

The channel state information $Lc_{l,n}$ is determined implicitly, by a so-called channel soft output being determined, which corresponds to the product of the channel state information $Lc_{l,n}$ and the respective received value $y_{l,n}$. For the channel soft output, the following relationship is true:

$$L_c y = L(x/y) - L(x) \tag{2}$$

where $L(x/y)$ is a reliability value which indicates the probability with which the value x occurs in the respective bit position of the code word when the received value y was received, and $L(x)$ is a reliability value which indicates how reliably the value x can be determined. For a so-called Gauss/fading channel, $L_c = 4aE_s/N0$, where a is the fading factor and $E_s/N_0$ is the signal/noise ratio.

The channel decoder 18 produces a received, source-encoded sequence $\{\hat{u}_l\}$ from source-encoded and channel-decoded received symbols $\hat{u}_l$. To each source-encoded received symbol $\hat{u}_{k-1,l}$ there belongs an observed reliability value $L^*(\hat{u}_{k-1,l})$, which is a so-called soft output from the channel decoder 18. The reliability value $L^*(\hat{u}_{k-1,l})$ is a measure of the reliability with which the source-encoded received symbol $\hat{u}_l$ could be determined by the channel decoder 18. The reliability value $L^*(\hat{u}_{k-1,l})$ generated by the channel decoder 18 will also be referred to below as the reliability value based on an observation or as the observed reliability value, in order to distinguish it from the reliability value $L(u_{k,l})$ calculated by the computing unit 20. The observed reliability value $L^*(\hat{u}_{k-1,l})$ is generated by the channel decoder 18 only after a delay of one frame k. The delay is indicated by the index k−1. In the exemplary embodiment of the invention explained below, the observed reliability value $L^*(\hat{u}_{k-1,l})$ is used in the computing unit 20 to determine the reliability value $L(u_{k,l})$ for the frame k that is currently being processed.

The source-encoded received symbols $\hat{u}_{k-1,l}$ and/or the observed reliability values $L^*(\hat{u}_{k-1,l})$ are input into a source decoder 22, which decompresses the source-encoded received symbols $\hat{u}_l$. A source-symbol sequence $\{l'\}$ is produced from received source symbols $l'$.

Two dashed arrows 24 and 26, which end at an adding unit 28, are intended to refer to the fact that, in the computing unit 20, in addition to the reliability values $L^*(\hat{u}_{k-1,l})$ or instead of these reliability values, the source-encoded received symbols $\hat{u}_l$ and/or information which has been generated in the source decoder 22 during the decoding are used. The computing unit 20 ultimately makes it possible for the received source symbol sequence $\{l'\}$ to agree essentially with the transmitted source symbol sequence $\{q_l'\}$, and therefore for the influence of channel disturbances during the transmission to be corrected to a sufficient degree.

Figure 2:
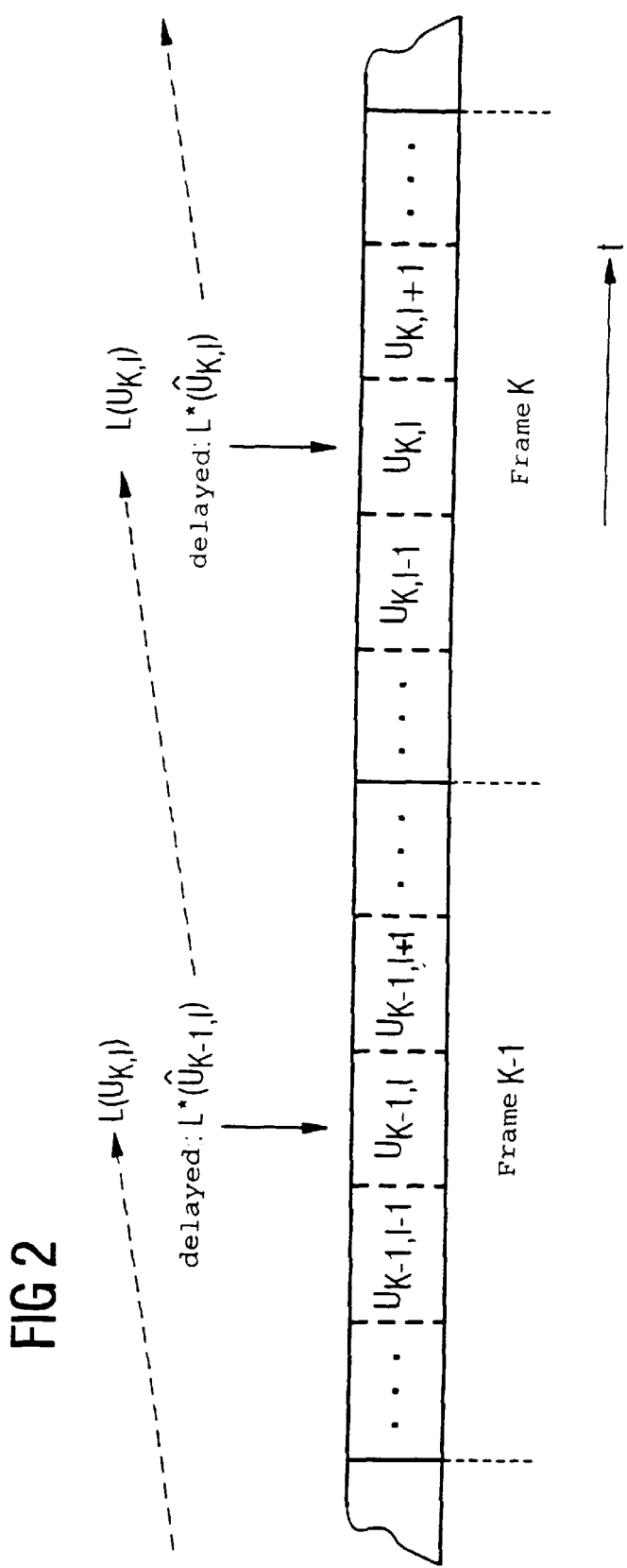
FIG. 2 is a schematic diagram of two frames of data to be transmitted.

Referring now to FIG. 2, there are shown two frames, namely the current frame k and the previous frame k−1, comprising source-encoded symbols $u_l$. To each frame k, k−1 there belong L source-encoded received symbols $u_l$, so that the index l runs from 0 to L−1. A relationship between the frames k, k−1, k−2, etc is produced only by the computing unit 20 according to FIG. 1. In the process, use is made of the fact that a pronounced correlation occurs between specific source-encoded symbols, for example the symbol $u_{k,l}$ and $u_{k-1,l}$, or between their reliability values $L(u_{k,l})$ and $L(u_{k-1,l})$ of successive frames k−1, k. In the invention, this correlation is reproduced by a mathematical model on the basis of which the reliability values $L(u_{k,l})$ are determined.

If the metric increments $M_l^{(m)}$ for the states belonging to the received symbol $\hat{u}_{k-1,l}$ are calculated, then in each case the reliability value $L(u_{k-1,l})$ is taken into account in accordance with formula (1). At this time, the reliability value $L^*(\hat{u}_{k-1,l})$ is not yet known. If the metrics $M_l^{(m)}$ for the states belonging to the received symbol $\hat{u}_{k,l}$ are subsequently determined, then the computing unit 20 (cf. FIG. 1) supplies a reliability value $L(u_{k,l})$ which has been calculated from the reliability value $L^*(\hat{u}_{k-1,l})$ known at this time. Therefore, in spite of the delay by one frame until the generation of the reliability value $L^*(\hat{u}_{k,l})$ based on an observation, a reliability value $L(u_{k,l})$ for the frame k is available with sufficient accuracy.

Figure 3:
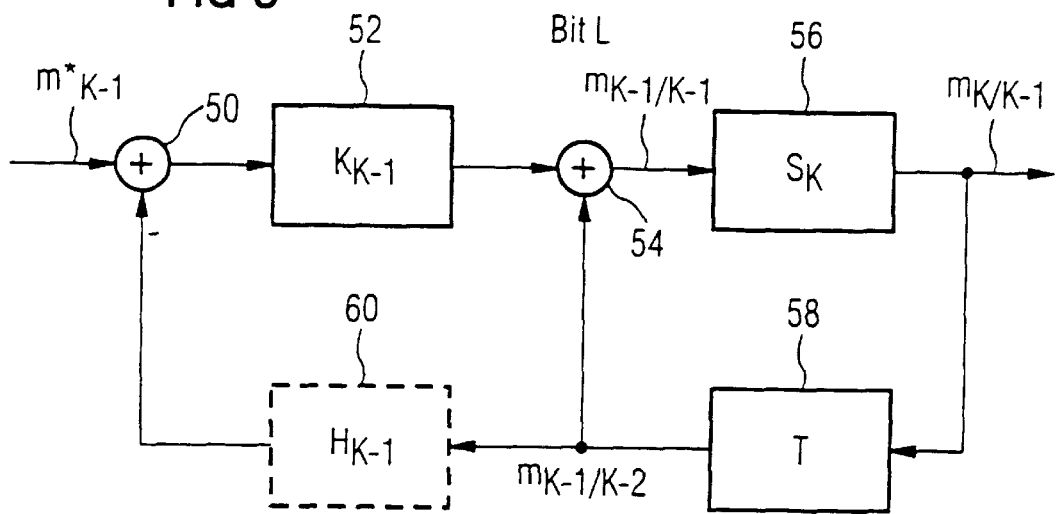
FIG. 3 is a schematic block diagram of a first type of calculation of an auxiliary reliability value in a Kalman filter.

Referring now to FIG. 3, there is shown a schematic representation of a first type of calculation of auxiliary reliability values in a Kalman filter. The auxiliary reliability values are explained further below, after the Kalman filter has first been explained in more detail.

In the following text, a style is used which follows the style used in the explanation of a Kalman filter in the article "Least-Squares Estimation: From Gauss to Kalman" by H. W. Sorenson, see IEEE Spectrum, Volume 7, pages 63–68, July 1970. The mathematical model used there in equations (11') and (10') is multidimensional. In order to explain an exemplary embodiment of the invention, however, reference is had to the simpler case of a one-dimensional model. In this case, vectors have only one component and are thus scalars. The following system model results:

$$x_k = \rho_k x_{k-1} + w_k \quad (3),$$

where $x_k$ is the state at the time k; $x_{k-1}$ is the state at the time k−1; $\rho_k$ is the correlation coefficient between $x_k$ and $x_{k-1}$; and $w_k$ is a system disturbance at the time k. This system model is used for modeling a so-called Markov process of first order. Another designation, often used, for such a system model is "autoregressive model of the first order."

The associated measurement model is:

$$z_k = x_k + v_k \quad (4),$$

where $z_k$ is a measured value at the time k and $v_k$ is a measurement disturbance at the time k. A measurement factor $H_k$ to be multiplied by $x_k$ has the value "1" and has therefore not been included in formula (4). The disturbances $w_k$ and $v_k$ are produced as a result of so-called white noise and have the average zero. Furthermore, the variance of $w_k$ is referred to as $Q_k$, and the variance of $v_k$ is referred to as $R_k$.

Starting from the models according to (3) and (4), the Kalman filter algorithm is defined by the following formulae, in agreement with Sorenson:

$$\hat{x}_{k/k-1} = \rho_k \hat{x}_{k-1/k-1} \quad (5)$$

$$P_{k/k-1} = \rho_k^2 P_{k-1/k-1} + Q_{k-1} \quad (6)$$

$$K_k = \frac{P_{k/k-1}}{P_{k/k-1} + R_k} \quad (7)$$

$$\hat{x}_{k/k} = \hat{x}_{k/k-1} + K_k(z_k - \hat{x}_{k/k-1}) \quad (8)$$

$$P_{k/k} = (1 - K_k) P_{k/k-1} \quad (9)$$

where $\hat{x}_k$ is an estimate for the state $x_k$ and $P_k$ is the covariance of the error $e_k = x_k - \hat{x}_k$. In the indices, the first index indicates the respective time k or k−1 at which the indexed variable is or was calculated. The index separated by a forward slash indicates the time at which the values needed to calculate the respectively indexed variable were available. In the following text, a style is also used in which the second index is left out if it is not needed for understanding.

The variances $Q_k$, $R_k$ and the correlation coefficient $\rho_k$ are preferably constant and are predefined at the beginning of the filtering operation. Measured values which have been measured previously are advantageously taken into account in the predefinition.

The Kalman filter algorithm indicated in formulae (5) to (9) is optimum in the sense of its mean square error, that is to say the sum of the deviations between the actual states $x_k$ and the estimated states $\hat{x}$ is a minimum.

Substituting formula (8) into formula (5) results in a so-called predictive estimation for $\hat{x}_{k+1/k}$:

$$\hat{x}_{k+1/k} = \rho_{k+1}(\hat{x}_{k/k-1} + K_k(z_k - \hat{x}_{k/k-1})) \quad (10)$$

An estimate $\hat{x}_{k+1/k+1}$ on the basis of a measured value $z_{k+1}$ available at the processing time k+1 results from substituting formula (5) into formula (8):

$$\hat{x}_{k+1/k+1} = \rho_{k+1} \hat{x}_{k/k} + K_{k+1}(z_{k+1} - \rho_{k+1} \hat{x}_{k/k}) \quad (11)$$

The estimated values $\hat{x}_{k+1}$ have a magnitude which is smaller than or equal to the maximum magnitude of the measured values $z_k$. The Kalman filter algorithm thus operates in a stable manner. The new measured value $Z_k$ and $Z_{k+1}$, respectively, produces a contribution $(z_k - \hat{x}_{k/k-1})$ and $(z_{k+1} - \rho \hat{x}_{k-1} \hat{x}_{k/k})$.

By means of ma thematical transpositions, in which in the formulae (7) and (9) the covariance $P_{k/k-1}$ is replaced using formula (6), and in which the covariance $P_{k-1/k-1}$ is subsequently eliminated, the following formula is given for calculating the gain factor K:

$$K_{k+1} = \frac{Q_k + \rho_{k+1}^2 R_k K_k}{Q_k + R_{k+1} + \rho_{k+1}^2 R_k K_k} \quad (12)$$

The result of formula (12) is that, when the measurement disturbances $V_k$ are very small by comparison with the system disturbances $w_k$, and therefore $R_k$ is significantly smaller than $Q_k$, the gain factor $K_k$ assumes approximately the value one. If the gain factor $K_k$ has the value one, then according to (10) and (11), the optimum estimated value $\hat{x}_{k+1}$ is determined only by the current measured value $z_k$ or $z_{k+1}$. If, on the other hand, the system disturbances $w_k$ are small by comparison with the measurement disturbances $V_k$, then the gain factor $K_k$ tends toward zero. It follows from equations (10) and (11), for a gain factor $K_k$ of approximately zero, that the optimum estimated value $\hat{x}_{k+1}$ depends only on the preceding estimated value $\hat{x}_k$. These properties of the Kalman filter ensure good estimation of the actual states $x_k$, which are error-free.

Equation (11) can also be written as follows:

$$\hat{x}_{k+1/k+1} = (1 - K_{k+1}) \rho_{k+1} \hat{x}_{k/k} + K_{k+1} z_k = h_0 \hat{x}_{0/0} + \sum_{j=1}^{k+1} h_j z_j \quad (13)$$

where $h_j$ are the filter constants independent of $z_j$ (j=1, ..., k+1). The estimated value $\hat{x}_{k+1}$ is therefore a linear combination of all the measured values $z_k$ present until now. The equations (10), (11) and (13) reveal that, in the estimated value $\hat{x}_{k+1}$, both the static correlation (statistic of first order) and the value distribution (statistic of zero order) of the measured values $z_k$ is taken into account.

The formulae indicated above can be used directly for calculating the reliability values $L^*(\hat{u}_{k,1})$ if $\hat{x}_{k+1}$ is replaced by and $z_k$ is replaced by $L^*(\hat{u}_{k,1})$. However, for the reasons cited below, it is expedient to use auxiliary reliability values $m(u_{k,l})$ and $m^*(\hat{u}_{k,1})$ instead of the reliability values $L^*(\hat{u}_{k,1})$ and $L^*(\hat{u}k,1)$, these auxiliary reliability values being given, for example, from a linearization of the extremely non-linear dependence of the reliability values $L(\hat{u}_{k,l})$ on a probability p.

The following definition generally applies to the reliability values:

$$L(u_1) = \log \frac{P(u_1 = +1)}{P(u_1 = -1)} = \log \frac{1-p}{p}. \quad (14)$$

Here, $u_l$ is viewed as a random variable having the elements {+1, −1}. $P(u_l = −1) = p$ is the probability that $u_l$ has the value "−1". $P(u_l = +1) = 1 − p$ is, on the other hand, the probability that $u_l$ has the value "+1". The abbreviation "log" represents the natural logarithm ln. The reliability values are also referred to as soft values or as the logarithmic probability ratio.

According to definition (14), the reliability value is a real number in the range from negative infinity to infinity [−∞, +∞]. If $u_l$ is classified as "+1" or "−1" using the values $L(u_l)$, then the sign sign ($L(u_l)$) indicates the so-called hard decision, and the magnitude $|L(u_l)|$ indicates the reliability of the decision, which is also referred to as the soft value.

If one considers formula (1) indicated above for calculating the metrics Mk(m), then this is determined solely by $L(u_{k,l})$ if the reliability value tends to "+" or "−". This is the case, as can be seen from formula (14), for p close to zero or for p close to one. In addition, in an implementation using a processor, the conversion of the log function is often disruptive. In one exemplary embodiment of the invention, the relationship between p and $L(u_k)$ is approximated linearly in order to eliminate these disadvantages:

$$L(u_k) \approx \overline{L}(u_k) = K(1-2p) = Km(u_k) \tag{15}$$

Where ($u_k$) is the approximated function, K is a constant and $m(u_k)$ are the auxiliary reliability values already mentioned. The constant K has the numeric value "2", so that the derivative of the function $L(u_k)$ on the basis of the probability p for the probability p=0.5 is equivalent to the derivative of the function ($u_k$) on the basis of the probability p at the point p=0.5.

The following relationship is true of the auxiliary reliability values $m(u_k)$:

$$m(u_k) = 1 - 2p = (-1)p + (+1)(1-p) = E\{u_k\} \tag{16}$$

It can be seen from this formula that the auxiliary reliability values $m(u_k)$ are the averages of $u_k$.

The relationship between the auxiliary reliability values and the reliability values is given by the formulae (14) and (16) as:

$$m(u_k) = \tanh \frac{L(u_k)}{2}. \tag{17}$$

$$L(u_k) = \log \frac{1 + m(u_k)}{1 - m(u_k)}. \tag{18}$$

The auxiliary reliability value $m(u_k)$ has a significance similar to that of the reliability value $L(u_k)$, that is to say the sign sign ($m(u_k)$) is the so-called hard decision and the magnitude $|m(u_k)|$ is the reliability of the decision—the so-called soft decision. The observed reliability value $L^*(\hat{u}_{k-1,l})$ generated by the channel decoder 18, see FIG. 1, in accordance with the formula (15) or (17) is converted into an auxiliary reliability value $m(u_{k-1,l})$, for example using a table. The auxiliary reliability value $m(u_{k,l})$ determined by the computing unit 20, see FIG. 1, is then converted into the reliability value $L(u_{k,l})$, likewise using a table. The approximation of the reliability values $L(u_k)$ by the auxiliary reliability values m(uk) according to equation (15) likewise leads to good results in practice.

In an exemplary embodiment of the invention using auxiliary reliability values $m_k$, the dependence on $u_k$ no longer being included, equations (10) and (12) give the following calculation rule for the Kalman filter:

$$m_{k/k-1} = \rho_k(m_{k-1/k-2} + K_{k-1}(m_{k-1} - m_{k-1/k-2})) \tag{19}$$

$$K_{k-1} = \frac{\sigma_{w,k-2}^2 + \rho_{k-1}^2 \sigma_{v,k-2}^2 K_{k-2}}{\sigma_{w,k-2}^2 + \sigma_{v,k-1}^2 + \rho_{k-1}^2 \sigma_{v,k-2}^2 K_{k-2}}. \tag{20}$$

Where $\sigma_{w,k}^2$ corresponds to the aforementioned variance $Q_k$, and $\sigma_{v,k}^2$ corresponds to the aforementioned variance $R_k$.

FIG. 3 shows the calculations according to formula (19) in a block schematic diagram. Using a subtraction unit 50, the expression ($m^*_{k-1} - m_{k-1/k-2}$) in the inner bracket in the formula (19) is calculated. The result is multiplied, in a multiplication unit 52, by the gain factor $K_{k-1}$, which has been calculated in accordance with formula (20). In an adding unit 54, the auxiliary reliability value $m_{k-1/k-2}$ is added to the result of the multiplication, by which means the expression inside the outer bracket in formula (19) is determined. The result of calculating this expression is then multiplied by the correlation factor ρ in a multiplication unit 56. The result of the multiplication is the auxiliary reliability value $m_{k/k-1}$ which, as already mentioned, is converted into a reliability value before it is used by the channel decoder 18 (cf. FIG. 1).

A delay unit 58 uses the auxiliary reliability value $m_{k/k-1}$, as a result of a delay by one frame, to generate the auxiliary reliability value $m_{k-1/k-2}$ for the next processing step. A multiplication unit 60 is indicated in FIG. 3 in which the auxiliary reliability value $m_{k-1/k-2}$ is multiplied by the measurement factor $H_{k-1}$, before it is used in the subtraction unit 50. However, as explained above in the exemplary embodiment, the measurement factor $H_{k-1}$ has the value one.

In another exemplary embodiment using auxiliary reliability values, the auxiliary reliability value m*k is already known at the time k, for example if iterative decoding is carried out. In this case, the two following formulae are true for the Kalman filter, in agreement with (11) and (12):

$$m_{k/k} = \rho_k m_{k-1/k-1} + K_k(m_k^* - \rho_k m_{k-1/k-1}) \tag{21}$$

$$K_k = \frac{\sigma_{w,k-1}^2 + \rho_k^2 \sigma_{v,k-1}^2 K_{k-1}}{\sigma_{w,k-1}^2 + \sigma_{v,k}^2 + \rho_k^2 \sigma_{v,k-1}^2 K_{k-1}}. \tag{22}$$

Figure 4:
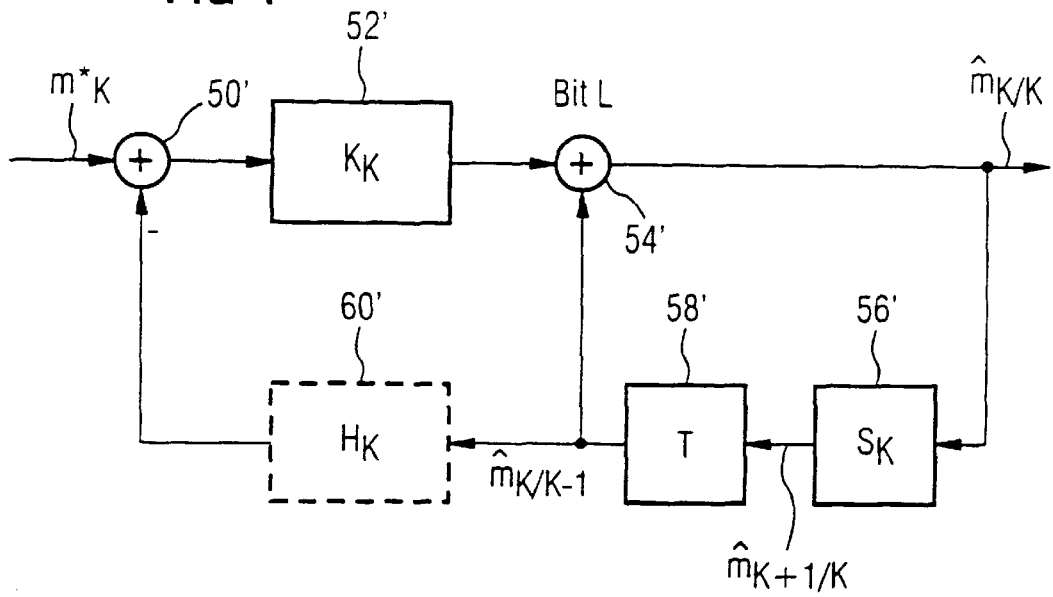
FIG. 4 is a schematic block diagram of a second type of calculation of an auxiliary reliability value in a Kalman filter.

FIG. 4 shows the calculation of the formula (21). The representation in FIG. 4 essentially corresponds to the representation in FIG. 3, so that functional units that have already been explained will not be explained again, but, in order to distinguish them, the associated reference symbols will receive a prime symbol. In FIG. 4, by comparison with FIG. 3, the index k−1 is replaced by the index k.

In the exemplary embodiments according to FIG. 3 or FIG. 4, the initial conditions selected are, for example: $m_{0/-1} = m_{0/0} = 0$ and $K_0 = 0$. The variances $\sigma_{w,k}^2$ and $\sigma_{v,k}^2$ are predefined on the basis of measured values. The correlation coefficient $\rho_k$ is likewise predefined on the basis of measured values, which are determined, for example, using FIG. 6 explained below. The variances $\rho_{w,k}^2$ and $\rho_{v,k}^2$ and the correlation coefficient $\rho_k$ can also be subsequently predefined during the filtering process, if appropriate experimentally determined functions are calculated dynamically.

In FIGS. 3 and 4, a Kalman filter is shown in each case for a bit position l of a frame k (cf. FIG. 2). As a rule there are a number of bit positions l which are correlated from frame to frame. In this case, a Kalman filter according to FIG. 3 or according to FIG. 4 is used in the computing unit 20 for each of these bit positions l (cf. FIG. 1).

Figure 5:
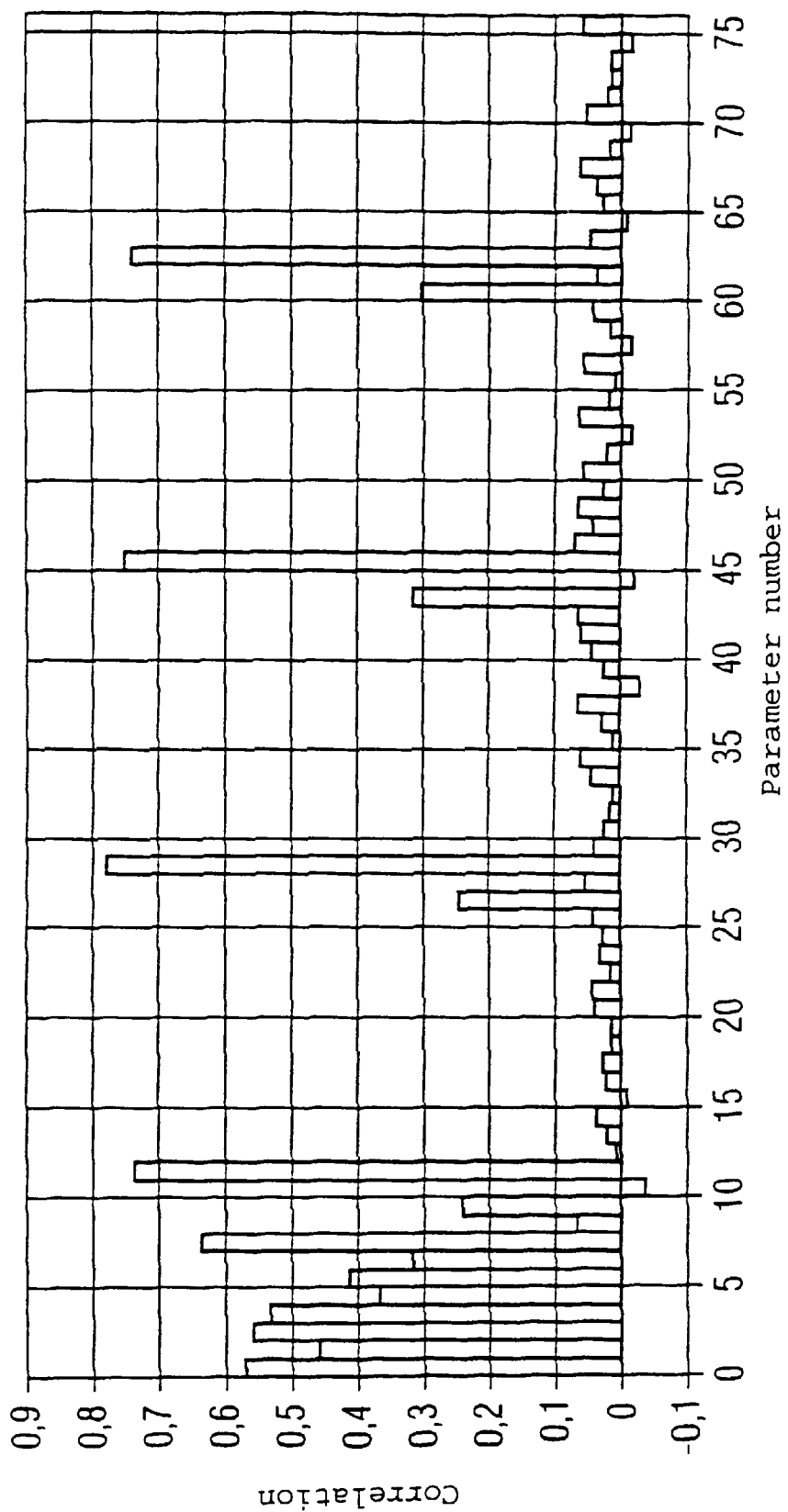
FIG. 5 is a chart of the correlation coefficients for various parameters from a GSM full-rate voice coder.

FIG. 5 shows a diagram in which the correlation coefficients for the parameter numbers 0 to 75 plotted on the X axis are shown on the Y axis. Parameters bearing the numbers 0 to 75 correspond to the parameters generated by a GSM full-rate voice coder, see GSM Recommendation 06.10 "European Digital Cellular Telecommunications System; Full Rate Speech Transcoding," 1995. The GSM full-rate voice coder is, for example, the source coder 10 in FIG. 1.

The parameters 0 to 7 are the so-called LAR coefficients (LAR=logarithmic area ratio), which are generated during the LPC analysis (LPC=linear prediction coding). The correlation between these coefficients is continuously greater than 0.3. The parameters numbers 9, 26, 43 and 60, which are measures of similarity b for the so-called LTP (long term prediction), also have a correlation which is greater than 0.2. In addition, in each frame there are four XMAX coefficients from the so-called RPE analysis (RPE=regular pulse excitation), which change only little from frame to frame and have a correlation coefficient greater than 0.7. Correlations between the above-mentioned parameters also occur in the more significant bit positions in which these parameters are transmitted.

FIG. 6 shows a diagram of the correlation coefficients for the bit positions 0 to 69 in a GSM frame. The values of many bit positions have a considerable inter-frame correlation, that is to say the correlation coefficient between $u_k$ and $u_{k-1}$ is greater than 0.3. Using the averaging shown in equation (16), it can be seen that the correlation coefficient k between $m(u_k)$ and $m(u_{k-1})$ must be quite considerably larger than the correlation coefficient between $u_k$ and $u_{k-1}$, typically 0.8 to 0.9 for the above-mentioned value, so that the mathematical model of formula (3) corresponds to the actual relationships, and the reliability values $L(u_{k,l})$ generated using the Kalman filter lead to an improvement in the decoding operation.

In a further exemplary embodiment of the invention, a multidimensional model is used instead of the one-dimensional model indicated in formulae (3) and (4). In this case, the vector style indicated in the aforementioned article by Sorensen applies. The multidimensional model is used in particular when, in addition to the inter-frame correlation, intra-frame correlations are also taken into account.

The calculation of the reliability values or of the auxiliary reliability values can also be determined without an optimization method, with an accuracy which is somewhat restricted but is still sufficient for many purposes. In this case, use is made of the relationship indicated above in formula (16) in that the auxiliary reliability values $m(u_k)$ are determined in accordance with the following formula:

$$m(u_k) = E\{u_k\} \approx \overline{u}_k = \frac{1}{N}\sum_{j=1}^{N} \hat{u}_{k-j} \quad (23)$$

where N is a predefined number of frames over which so-called windowing is carried out, that is to say only the source-encoded received symbols $\hat{u}_{k,l}$ of the last N frames are taken into account. Even rapid changes in the signal to be estimated are registered by means of this measure.

Instead of the received symbols $\hat{u}_k$, the associated auxiliary reliability values $m(u_k)$ or $m^*(\hat{u}_k)$ can also be used. The auxiliary reliability values $m(u_k)$ determined are then processed further as explained above.

Formula (23) can also be expressed in the following way by means of the definition of the auxiliary reliability values, namely m=1−2p:

$$\hat{p} = \frac{\text{number of bits } \hat{u}_{k-j} = -1 (j = 1, 2, \ldots, N)}{N} \quad (24)$$

Using the last N decoded received symbols $\hat{u}_{k-1}, \hat{u}_{k-2}, \ldots, \hat{u}_{k-N}$, the determination of the probability p is carried out first as the relative frequency of values "−1". The reliability value $L(u_k)$ is then calculated directly by means of formula (14), whereby the probability is to be substituted by the approximated probability.

I claim:

1. A method of processing data received by a receiver, which comprises:

receiving data transmitted in successive frames, each containing a predefined number of bit positions, via a transmission link;

processing the received data with a maximum a posteriori probability algorithm using one of metric increments and a maximum likelihood algorithm;

calculating the metric increments for at least one bit position, whose value and/or whose reliability value is correlated from frame to frame, in dependence from a current reliability value determined for the frame being currently processed, whereby the current reliability value is a measure of a probability that the value of the bit position has a predefined value;

determining the current reliability value by using at least one observed reliability value determined for the bit position from a previously processed frame or from the frame being currently processed; and determining the current reliability value such that a sum formed over several frames of the deviations of an error-free reliability value for the respective frame and of the reliability value determined for the same frame assumes a minimum.

2. The method according to claim 1, which comprises determining the reliability values in accordance with the relationship:

$$L(u_l) = \log\frac{P(u_l = +1)}{P(u_l = -1)}$$

where $L(u_l)$ is the reliability value, $u_l$ denotes the value of the bit position l within the frame, $P(u_l=+1)$ is a probability that the value in the bit position l has a first value, and where $P(u_l=-1)$ is a probability that the value in the bit position l has a second value.

3. The method according to claim 2, which comprises defining the first value as being a numeric value +1 and defining the second value as a numeric value −1.

4. The method according to claim 1, which comprises calculating the current reliability value recursively from the reliability value of a previously determined frame.

5. The method according to claim 4, wherein the step of recursively calculating comprises using a Kalman filter and the reliability value of the last processed frame.

6. The method according to claim 4, wherein the step of calculating the current reliability value in accordance with a formula selected from the group consisting of the following formulae:

$$L_k = \rho_k(L_{k-1} + K_{k-1}(L_{k-1}^* - L_{k-1}))$$

and $$L_k = \rho_k L_{k-1} + K_k(L_k^* - \rho_k L_{k-1}))$$

where $L_k$ is the reliability value for a frame k, $\rho_k$ is a predefined correlation coefficient, $L^*_{k-1}$ is an observed reliability value for the frame k−1 and $L^*_k$ is an observed reliability value for the frame k−1;

and where $K_k$ or $K_{k-1}$ is a gain factor calculated recursively in accordance with the following formula:

$$K_k = \frac{\sigma_{w,k-1}^2 + \rho_k^2 \sigma_{v,k-1}^2 K_{k-1}}{\sigma_{w,k-1}^2 + \sigma_{v,k}^2 + \rho_k^2 \sigma_{v,k-1}^2 K_{k-1}}$$

wherein $\rho_{w,k-1}^2$ is a variance of a system disturbance and $\rho_{v,k-1}^2$ is a variance of a measurement disturbance.

7. A method of processing data received by a receiver, which comprises:
   receiving data transmitted in successive frames each containing a predefined number of bit positions over a transmission link;
   processing the received data with a maximum a posteriori probability algorithm using one of metric increments and a maximum likelihood algorithm;
      wherein the metric increments for at least one bit position whose value and/or reliability value is correlated from frame to frame is calculated in dependence of a current reliability value determined for a frame currently being processed and which is a measure of a probability that the value of the bit position can be determined without error; and
      wherein, in determining the current reliability value, use is made of at least one observed reliability value determined for the bit position from a previously processed frame or from the frame being currently processed;
   determining an observed auxiliary reliability value from the observed reliability value with one of a precise conversion function and an approximation function;
   determining a current auxiliary reliability value such that a sum formed over several frames of the deviations of an error-free auxiliary reliability value for the respective frame and of the auxiliary reliability value determined for the same frame becomes a minimum; and
   using one of the conversion function and the approximation function to determine the current reliability value from the determined auxiliary reliability value.

8. The method according to claim 7, wherein the auxiliary reliability value satisfies the following formula:

$$m(u_l) = P(u_l = +1) - P(u_l = -1),$$

where $u_l$ denotes the value of a bit position l within the frame, $P(u_l = +1)$ is a probability that the value $u_l$ has a first value, and where $P(u_l = -1)$ is the probability that the value $u_l$ has a second value.

9. The method according to claim 8, which comprises defining the first value as being a numeric value +1 and defining the second value as a numeric value −1.

10. The method according to claim 7, which comprises calculating the current auxiliary reliability value recursively from the auxiliary reliability value determined for the frame last processed.

11. The method according to claim 10, which comprises calculating the current auxiliary reliability value with a Kalman filter.

12. The method according to claim 7, wherein the current auxiliary reliability value is calculated in accordance with a formula selected from the group consisting of:

$$m_k = \rho_k(m_{k-1} + K_k(m_{k-1}^* - m_{k-1}))$$

and $$m_k = \rho_k m_{k-1} + K_k(m_k^* - \rho_k m_{k-1})$$

where $m_k$ is the auxiliary reliability value for the frame k, $\rho_k$ is a correlation coefficient, m*k and, respectively, m*$_{k-1}$ is the observed auxiliary reliability value and $K_k$ and $K_{k-1}$, respectively, is a gain factor.

13. The method according to claim 12, which comprises determining the gain factor $K_k$ in accordance with the following formula:

$$K_k = \frac{\sigma_{w,k-1}^2 + \rho_k^2 \sigma_{v,k-1}^2 K_{k-1}}{\sigma_{w,k-1}^2 + \sigma_{v,k}^2 + \rho_k^2 \sigma_{v,k-1}^2 K_{k-1}}$$

where $\sigma_{w,k-1}^2$ is the variance of a system disturbance and $\sigma_{v,k-1}^2$ is the variance of a measurement disturbance.

14. The method according to claim 13, which comprises predefining the correlation coefficient $\rho_k$, the variance $\sigma_w^2$ of the system disturbance and the variance $\sigma_v^2$ of the measurement disturbance.

15. The method according to claim 14, which comprises taking measurements into account in the predetermining step.

16. The method according to claim 7, which comprises determining the current reliability value with the following mathematical model:

$$X_k = \Phi_{k,k-1} X_{k-1} + W_k$$

and $$Z_k = H_k X_k + V_k$$

where $X_k$ denotes a state vector for the frame k, $\Phi_k$ denotes a system matrix, $W_k$ denotes a system disturbance vector, $Z_k$ denotes a measurement vector, $H_k$ denotes a measurement matrix, and $V_k$ denotes a measurement disturbance vector.

17. The method according to claim 7, wherein the transmitting step comprises transmitting data in encoded form.

18. The method according to claim 7, which comprises transmitting and decoding data transmitted in a mobile radio system standard.

19. The method according to claim 18, wherein the mobile radio system is a GSM system.

20. The method according to claim 18, wherein the bit transmitted in the bit position is a more significant bit of a parameter transmitted in the frame.

21. A device for processing received data, comprising:
   a receiving unit for receiving data transmitted via a transmission link in frames comprising a predefined number of bit positions;
   a metric increment unit connected to said receiving unit for processing the received data with a maximum a posteriori probability algorithm using one of metric increments and a maximum likelihood algorithm;
   a computing unit connected to said metric increment unit for determining, for at least one bit position whose value and/or reliability value is correlated from frame to frame, a current reliability value and outputting the current reliability value to said metric increment unit;
      said computing unit, in determining the current reliability value, using at least one observed reliability value which has been determined for the bit position from one of a previously processed frame and a frame currently being processed;
      said computing unit, in a first option, determining the reliability value such that a sum formed over several frames of the deviations of an error-free reliability value of a frame and of the reliability value determined for the same frame becomes a minimum;
      said computing unit, in a second option, determining the reliability value such that a sum formed over several frames of the deviations of an essentially error-free auxiliary reliability value for the respective frame and an auxiliary reliability value determined for the same frame becomes a minimum, the auxiliary reliability values) being calculated from the reliability values by one of a conversion function and an approximation function.

22. A method of processing data received by a receiver receiving data in successive frames each containing a predefined number of bit positions over a transmission link, which comprises:

processing the received data with a maximum a posteriori probability algorithm using one of metric increments and a maximum likelihood algorithm;

calculating the metric increments, for at least one bit position whose value and/or reliability value is correlated from frame to frame, from a current reliability value determined for the frame currently being processed, which is a measure of the probability that the value of the bit position has a predefined value;

determining the current reliability value with at least two observed reliability values, or at least two already determined reliability values, which are determined for the bit position from associated frames; and forming the current reliability value, by averaging the observed reliability values, or from the reliability values already determined.

23. The method according to claim 22, which comprises forming a average for a constant number of already processed frames.

24. The method according to claim 22, wherein the forming step comprises using the reliability values of the frames last processed.

25. The method according to claim 22, which comprises converting auxiliary reliability values into reliability values, using one of a conversion function and an approximation function, to calculate the metric increment.

26. The method according to claim 22, wherein the observed reliability values are the processed data output by one of the maximum a posteriori probability algorithm and the maximum likelihood algorithm.

27. A device for processing received data, comprising:

a receiving unit for receiving data via a transmission link, whereby the data are transmitted in frames comprising a predefined number of bit positions;

a metric increment unit connected to said receiving unit for processing the received data by a maximum a posteriori probability algorithm using one of metric increments and a maximum likelihood algorithm;

a computing unit connected to said metric increment unit, said computing unit, for at least one bit position whose value and/or reliability value is correlated from frame to frame, determining a current reliability value and outputting the current reliability value to said metric increment unit, whereby the reliability value is a measure of a probability that the bit position has a predefined value; and said computing unit calculating the current reliability value by averaging at least two observed reliability values, or at least two already determined reliability values, determined for the bit position from associated frames.

* * * * *

UNITED STATES PATENT AND TRADEMARK OFFICE
CERTIFICATE OF CORRECTION

PATENT NO. : 6,393,075 B1
DATED : May 21, 2002
INVENTOR(S) : Wen Xu

It is certified that error appears in the above-identified patent and that said Letters Patent is hereby corrected as shown below:

<u>Title page,</u>
Item [54], should read as follows:
-- METHOD AND DEVICE FOR SOURCE-CONTROLLED CHANNEL DECODING USING A KALMAN FILTER --

Signed and Sealed this

Twenty-fourth Day of September, 2002

Attest:

Attesting Officer

JAMES E. ROGAN
*Director of the United States Patent and Trademark Office*